SWITCHING TRANSISTORS

Filed July 17, 1958

INVENTORS R. C. BUSCHERT
S. L. MILLER
BY
Arthur J. Torsiglieri
ATTORNEY

United States Patent Office 2,964,689
Patented Dec. 13, 1960

2,964,689

SWITCHING TRANSISTORS

Robert C. Buschert, Parsippany, N.J., and Solomon L. Miller, Poughkeepsie, N.Y., assignors to Bell Telephone Laboratories, Incorporated, New York, N.Y., a corporation of New York Filed July 17, 1958, Ser. No. 749,227

3 Claims. (Cl. 317—235)

Figure 1:
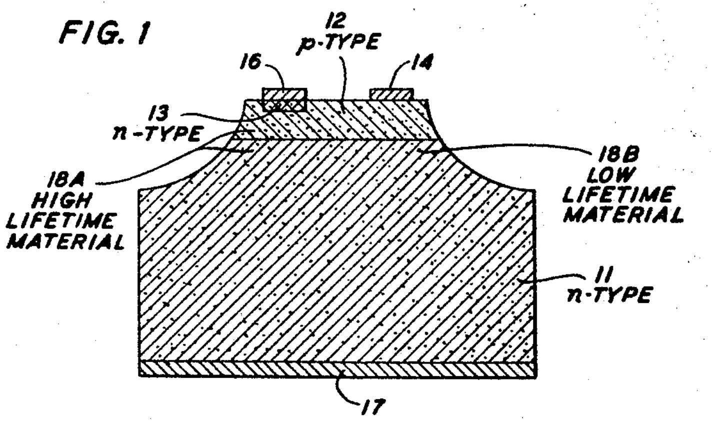

This invention relates to junction transistors and to their fabrication.

An object of the invention is a junction transistor which can be switched very quickly between a state in which it presents a low impedance across a pair of its electrodes and one in which it presents a high impedance across the same pair of terminals.

An important application of a junction transistor is as a switching element for providing a high impedance under one set of operating conditions and a low impedance under a different set of operating conditions. Typically, a high impedance state is achieved between the emitter and collector electrodes by providing operating conditions which result in a reverse bias on the collecting junction, and a low impedance state is achieved between such electrodes by driving the collector current to saturation by introducing a sufficiently large current in the base electrode so that a forward bias results on the collecting junction. In this application, one important limitation on the speed with which such a transistor can be switched from a low impedance state back to a high impedance state is the storage of minority carriers near the collecting junction, since such storage delays the reduction to low values of the current flowing in the emitter-collector circuit. The general principles applicable to the switching of transistors between high and low impedance states are set forth in a paper entitled "Large Signal Behavior of Junction Transistors," by J. J. Ebers and J. L. Moll, Proceedings of the I.R.E., volume 42, page 1761, December 1954. A general discussion of the various characteristics desirable in a switching transistor is found in United States Patent 2,810,870, which issued October 22, 1957.

To minimize carrier storage and thereby maximize the speed of switching from a low impedance state to a high impedance state, it is necessary to reduce the lifetime of minority carriers in the material near the collecting junction. However, it is generally regarded as disadvantageous to reduce the lifetime of minority carriers in the material on the base side of the collecting junction of the usual form of junction transistor, since such reduction leads to a decrease in the value of alpha, the current amplification factor, and a consequent decrease in the speed with which the transistor can be switched from a high impedance state to a low impedance state. Since there are no fabricating techniques known which can be controlled to the extent that would be required to effect a significant reduction in lifetime of material on the collector side of the collecting junction without affecting undesirably the material on the base side of the collecting junction, there are practical difficulties to an effective solution of the carrier storage problem in the usual form of junction transistor.

However, we have discovered that in junction transistors in which the lateral resistance of the base zone is significant, which is generally the case in junction transistors having thin base zones, carrier storage is most pronounced along those portions of the collecting junction which are closest to the base electrode. In addition, it has been known that to maintain a high alpha it is of primary importance to maintain high only the lifetime of the base material located between the emitting and collecting junctions where the transistor action occcurs. By combining our discovery with such previous knowledge, we have recognized that by an appropriate geometry for the junction transistor the region where carrier storage is important, and so where the lifetime of the material should advantageously be short, can be separated from the region where transistor action occurs, and so where the lifetime of the material should advantageously be long. As a consequence of such separation it becomes feasible to minimize carrier storage at the region of its concentration by utilizing low lifetime material selectively in such region and simultaneously to maintain the alpha high by utilizing high lifetime material in that portion of the base zone which lies between the emitting and collecting junctions where transistor action occurs.

In particular, to achieve the desired separation it is important to provide a geometry for the junction transistor in which the collecting junction has a portion close to the base electrode and removed from the emitting junction where the lifetime can be made short, and a portion opposite the emitting junction and removed from the base electrode where the lifetime can be made long. In this way carrier storage may be minimized without deleterious effect on the transistor action.

Accordingly, a feature of the present invention is a semiconductive wafer including at least a pair of rectifying junctions which serve as the emitting and collecting junctions of a junction transistor, of which the emitting junction overlies only a portion of the collecting junction and the material adjacent that portion selectively is of high lifetime, and the base electrode is closest to other portions of the collecting junction where the material is of low lifetime. Various techniques are possible for realizing the desired difference in lifetimes in various regions of the semiconductive element.

Transistor structures are known already which have a suitable geometry. In such structures, the advantages of the invention are readily achieved by providing additionally that the lifetime of the material near that portion of the collecting junction close to the base electrode is short relative to that of the material of the portion of the collecting junction opposite the emitting junction.

Figure 2A:
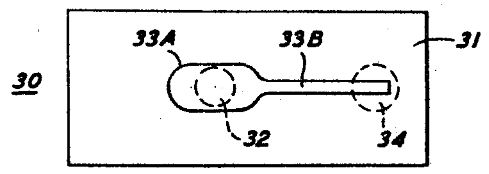
Figure 2B:
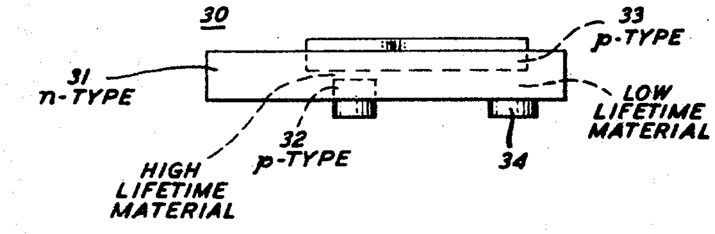

The invention will be better understood from the following more detailed description taken in conjunction with the accompanying drawing in which:

Fig. 1 shows in section a diffused base transistor which has been modified in accordance with the invention; and Figs. 2A and 2B are top and side views of an alloy junction transistor which has been modified in accordance with this invention.

With reference now to the drawing, Fig. 1 shows a junction transistor whose geometry adapts it especially for high frequency operation. The transistor includes a semiconductive wafer whose bulk portion 11, which is of n-type conductivity, serves as the collector zone. A mesa portion sits on one major face of the wafer of which a major surface portion 12 is p-type and serves as the base zone. The collecting junction which separates zones 11 and 12 extends parallel to and is coextensive with the plane surface of the mesa. A minor surface portion 13 of the mesa is n-type and serves as the emitter zone. As shown, the emitter zone is located on the left hand half of the mesa and base electrode 14 makes a low resistance connection in the right hand half of the base zone. Typically, the emitter zone 13 is linear extending in a direction perpendicular to the plane of the drawing a distance at least several times its width and base electrode 14 similarly is linear and extends parallel to the emitter zone along an appreciable portion of its length. Emitter electrode 16 extends along a major portion of the length of the emitter zone. The collector electrode 17 forms a large area connection with the entire surface of the wafer opposite the mesa. Advantageously, the base zone 12 is characterized by an acceptor impurity concentration which decreases with distance from the emitting junction to the collecting junction to provide a built-in field which adds a drift component to the flow of electrons from the emitter to the collector. Transistors having the general configuration described are now well known and usually described as diffused base transistors. A typical process for fabricating such a transistor is described in application Serial No. 496,202, filed March 23, 1955, by G. C. Dacey, C. A. Lee and W. Shockley.

In accordance with the present invention, the material of the semiconductive wafer adjacent that portion 18A of the collecting junction which underlies the emitter zone is made to have a lifetime for minority carriers which is high compared to that of the material adjacent the portion 18B of the collecting junction which underlies the base electrode 14. Ratios of at least three and advantageously in excess of five are desired. Even higher ratios are preferred in units designed for very high switching speeds. In some instances, particularly with germanium units, it may be desirable to avoid reducing the lifetime unduly since the lower the lifetime of material adjacent the collecting junction the higher the reverse currents. However, in such a transistor, it is now feasible to make the lifetime of the materia intermediate between the emitting and collecting junctions as high as possible, since the problem of carrier storage no longer need militate against the use of high liftime material in the base zone.

It is usually preferable for achieving different lifetimes in different parts of a wafer to begin with high lifetime material throughout and thereafter to reduce the lifetime in those regions where it is desired to be low.

Various techniques are available for reducing the lifetime of the material of a restricted portion of a semiconductive element. A known technique well adapted for control involves bombardment of the semiconductive element with high energy particles, for example, electrons. Such bombardment apparently introduces lattice imperfections which reduce the lifetime. Other techniques include the introduction locally in the region where the lifetime is to be reduced of appropriate impurities, for example, copper in germanium and iron or gold in silicon. Typically, such introduction may be by diffusion from a surface layer of the impurity localized by evaporation to the particular region where the lifetime is desired to be low. Additionally, plastic deformation or special heat treatments can be used for reducing the lifetime of semiconductive material.

Conversely, it is feasible to begin with low lifetime material throughout, as by introducing an appropriate impurity and thereafter to increase the lifetime in selected regions of the wafer, as by gettering the impurity from such regions. For example, lead is known to getter copper in germanium while nickel can be used to getter gold in silicon.

In one specific embodiment of the invention there was prepared a monocrystalline silicon wafer substantially of the geometry shown in Fig. 1, in which the wafer was fifty mils square and twenty mils thick. The mesa region was about ten mils square and about a few mils thick. The base zone had a thickness of a fraction of a mil and the base electrode was an aluminum stripe six mils long, two mils wide and a small fraction of a mil thick. The emitter zone was six mils long, three mils wide and a fraction of a mil thick and the emitter electrode was a gold-antimony stripe three mils long, one and a half mils wide and a small fraction of a mil thick. A twenty mils thick lead shield was adjusted over the emitter zone half of the mesa and the exposed base connection half of the mesa was irradiated in a Van de Graaf generator. A dosage of about $8 \times 10^{14}$ electrons per square centimeter of .75 million electron volts energy was found satisfactory to improve by at least five times the speed with which the transistor could be switched from a low impedance state to a high impedance state.

It was actually found advantageous to irradiate at one time a large wafer which included a ten by ten array of individual units of the kind shown in Fig. 1. Ten lead strips were used, one for shielding each row of ten emitter zones. After irradiation the large wafer was cut up into a hundred individual units.

Figs. 2A and 2B show a junction transistor having a geometry particularly well adapted both for fabrication by an alloy process and for incorporation of the principles of the invention. The bulk of the semiconductive wafer 30 serves as the n-type base zone 31. The p-type emitter zone 32 is an alloy region on one broad face and the p-type collector zone 33 is an alloy region on the opposite broad face in the manner c aracteristic of known alloy junction transistors. To facilitate incorporation of the principles of the invention, the collector zone is key-hole in shape including a circular portion 33A which is opposite the circular emitter zone and a linear portion which extends outward from the circular portion sufficiently to underlie the region where electrode 34 makes a low resistance connection to the base zone. The configurations of the emitter and collector zones are readily controlled by the shape of the acceptor-rich pellets alloyed to the semiconductor for forming such zones.

In a junction transistor of the geometry described, it is relatively easy to provide that the lifetime of the material adjacent the linear portion 33B of the collecting junction be low and the lifetime of the material adjacent the circular portion 33A of the collecting junction be high. Any of the techniques previously described may similarly find use here.

It is to be understood that the specific embodiments described are merely illustrative of the principles of the invention. It is believed obvious that various modifications may be devised by one skilled in the art without departing from the spirit and scope of the invention. In particular, it is feasible to provide a junction transistor in which two distinct electrodes make low resistance connection to the base zone. In such an instance, it is preferable to reduce the lifetime of the material adjacent the portions of the collecting junction most proximate to each of the base electrodes. Similarly, it is believed obvious that the principles of the invention may be extended to junction transistors utilizing other forms of semiconductors, such as germanium-silicon alloys and group III–group V semiconductive compounds. Similarly, it is believed evident that the principles of the invention are applicable to junction transistors in which the collector comprises either a pair of zones, as in a PNPN transistor, or an intrinsic region, as in a PNIP transistor.

What is claimed is:

1. A junction transistor comprising a semiconductive wafer including an emitter, a base and a collector separated by emitting and collecting junctions, and emitter, base and collector electrodes, the collecting junction including a first portion which is opposite to the emitting junction and removed from the base electrode and a second portion which is relatively close to the base electrode and removed from the emitting junction, characterized in that the lifetime of the semiconductive material adjacent the first portion of the collecting junction is higher than the lifetime of the semiconductive material adjacent the second portion of the collecting junction.

2. A junction transistor comprising a semiconductive wafer including an emitter, a base and a collector defining therebetween emitting and collecting junctions, the emitting junction extending opposite only a limited portion of the collecting junction, and the lifetime of the portion of the base positioned intermediate between the emitting and collecting junctions being relatively high, and emitter, base and collector electrodes, the base electrode connecting to a portion of the base of relatively low lifetime which is removed from a position intermediate between the emitting and collecting junctions.

3. A junction transistor comprising a semiconductive wafer having an emitter, a base and a collector, the emitter and base being included in a mesa portion which is positioned on the bulk portion which forms the collector, the emitter occupying a limited surface portion of the mesa portion and the base occupying the remaining surface portion of the mesa portion and the region intermediate between the emitter and collector, and an emitter electrode connected to the emitter, a collector electrode connected to the collector, and a base electrode connected to the base at said remaining surface portion of the mesa portion characterized in that the base is of high lifetime material in the region intermediate between the emitter and collector zones where transistor action occurs and of low lifetime in the region of the base electrode connection.

References Cited in the file of this patent

UNITED STATES PATENTS

| | | |
|---|---|---|
| 2,770,761 | Pfann | Nov. 13, 1956 |
| 2,790,940 | Prince | Apr. 30, 1957 |
| 2,792,540 | Pfann | May 14, 1957 |
| 2,810,870 | Hunter et al. | Oct. 22, 1957 |
| 2,813,233 | Shockley | Nov. 12, 1957 |
| 2,861,018 | Fuller et al. | Nov. 18, 1958 |
| 2,879,190 | Logan et al. | Mar. 24, 1959 |